(12) United States Patent
Rudolph

(10) Patent No.: US 6,440,220 B1
(45) Date of Patent: Aug. 27, 2002

(54) METHOD AND APPARATUS FOR INHIBITING INFILTRATION OF A REACTIVE GAS INTO POROUS REFRACTORY INSULATION

(75) Inventor: James Warren Rudolph, Colorado Springs, CO (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 09/177,990

(22) Filed: Oct. 23, 1998

(51) Int. Cl.$^7$ ............................................. C23C 8/06
(52) U.S. Cl. .................. 118/723; 118/723 I; 118/723; 118/723 AN
(58) Field of Search ............... 313/146; 204/298.21, 204/192 R, 298, 192.15, 298.08; 219/192.15; 118/723, 720, 723 AN, 723 I; 216/68; 427/585

(56) References Cited

U.S. PATENT DOCUMENTS

| | | | |
|---|---|---|---|
| 1,933,461 A | | 10/1933 | Toll .......................... 432/260 |
| 3,460,510 A | * | 8/1969 | Currin ....................... 118/720 |
| 3,884,793 A | * | 5/1975 | Penfold et al. ............. 204/298 |
| 3,995,187 A | * | 11/1976 | Penfold et al. ......... 313/346 R |
| 4,030,996 A | * | 6/1977 | Penfold et al. ......... 204/192 R |
| 4,031,424 A | * | 6/1977 | Penfold et al. ............. 313/146 |
| 4,422,407 A | * | 12/1983 | Bessot et al. ............... 118/723 |
| 4,573,431 A | | 3/1986 | Sarkozy ...................... 118/725 |
| 4,606,650 A | | 8/1986 | Harris ........................... 374/14 |
| 4,794,220 A | * | 12/1988 | Sekiya ................... 219/10.491 |
| 4,854,266 A | | 8/1989 | Simson et al. .............. 118/728 |
| 5,073,241 A | * | 12/1991 | Watanabe .............. 204/192.15 |
| 5,377,297 A | | 12/1994 | Nuutinen .................... 392/307 |
| 5,460,707 A | * | 10/1995 | Wellerdieck .......... 204/298.08 |
| 5,470,452 A | * | 11/1995 | Dickey et al. ......... 204/298.21 |
| 5,477,975 A | * | 12/1995 | Rice et al. ..................... 216/68 |
| 5,480,678 A | | 1/1996 | Rudolph et al. ......... 427/248.1 |
| 5,522,934 A | * | 6/1996 | Suzuki et al. ......... 118/723 AN |
| 5,580,385 A | * | 12/1996 | Paranjpe et al. .......... 118/723 I |
| 5,625,170 A | | 4/1997 | Poris ............................ 177/50 |
| 5,725,746 A | * | 3/1998 | Dickey et al. ......... 204/298.21 |
| 5,853,485 A | | 12/1998 | Rudolph et al. ............. 118/715 |
| 5,900,297 A | | 5/1999 | Rudolph et al. ........... 428/66.2 |
| 5,910,006 A | | 6/1999 | Conroy et al. .............. 432/250 |
| 6,120,640 A | * | 9/2000 | Shih et al. ................... 156/345 |

FOREIGN PATENT DOCUMENTS

| | | |
|---|---|---|
| EP | 0 410 442 A1 | 1/1991 |
| EP | 0 832 863 A2 | 1/1998 |
| EP | 0 846 787 A1 | 6/1998 |

OTHER PUBLICATIONS

J. Linke et al, Behavior of Boron Doped Graphites, Plasma Sprayed B4C, and a–C/B:H as Plasma Facing Material, Fus. Tech. 20, 228–231, Sep. 1991.*

Ponnekanti et al, Failure modes of anodized aluminum parts used in CVD chambers, J. Vac. Sci. Tech. A 14(3), May 1996.*

M. Brown, "Seals and Sealing Handbook", 4th Ed., 1995, pp. 422–423.*

W.V. Kotlensky, *Deposition of Pyrolytic Carbon in Porous Solids*, 8 Chemistry and Physics of Carbon, 173, 190–203 (1973).

W.J. Lackey, *Review, Status, and Future of the Chemical Vapor Infiltration Process for Fabrication of Fiber–Reinforced Ceramic Composites*, Ceram. Eng. Sci. Proc. 10[7–8] 577–81 (1989).

* cited by examiner

*Primary Examiner*—Gregory Mills
*Assistant Examiner*—Rudy Zervigon
(74) *Attorney, Agent, or Firm*—Brinks Hofer Gilson & Lione

(57) ABSTRACT

The invention is relates to CVI/CVD furnace apparatus. More specifically, the invention is directed to methods and apparatus for inhibiting infiltration of reactive gas into insulation for a high temperature CVI/CVD furnace. A method and apparatus is provided that inhibits infiltration of reactant gas into porous insulation over extended periods of time, preferably the life of the furnace.

9 Claims, 3 Drawing Sheets

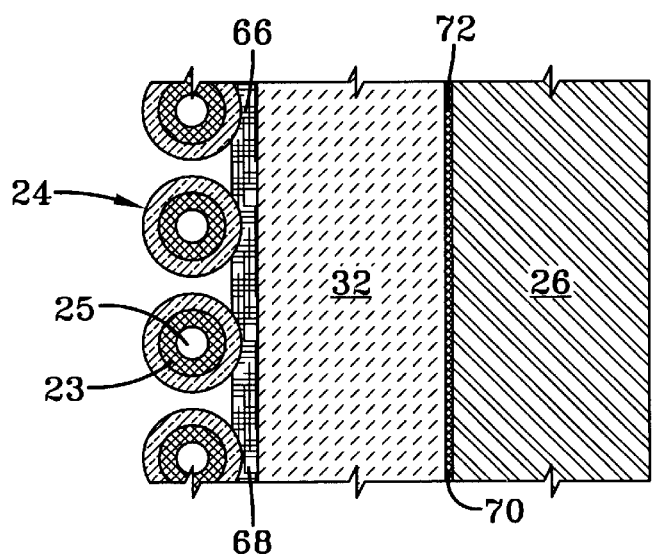
FIG-5
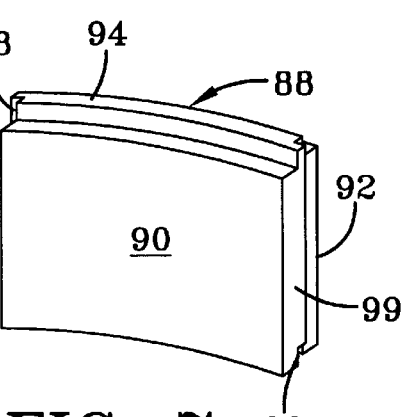
FIG-6
FIG-7
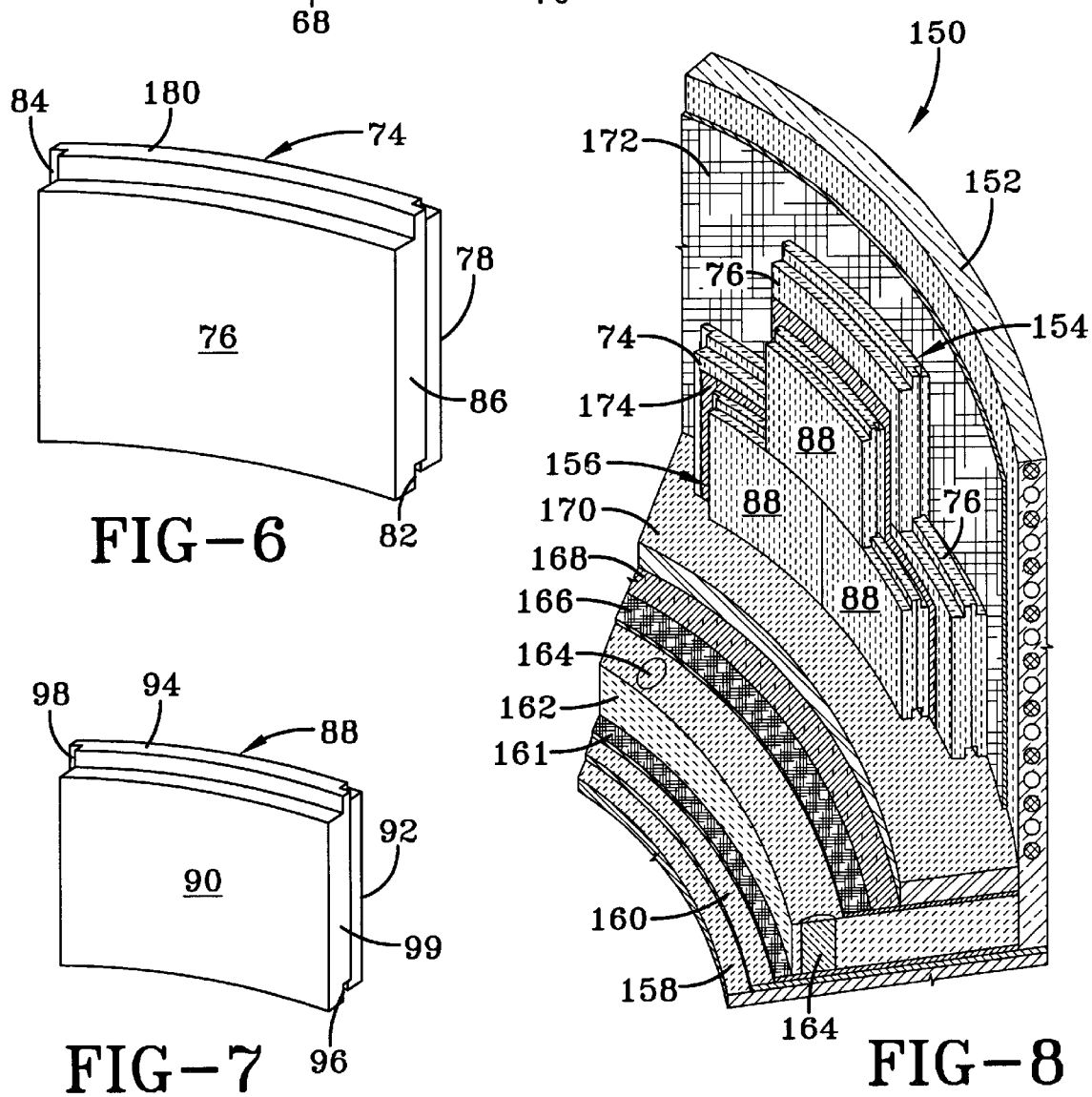
FIG-8

METHOD AND APPARATUS FOR INHIBITING INFILTRATION OF A REACTIVE GAS INTO POROUS REFRACTORY INSULATION

BACKGROUND

The invention is relates to CVI/CVD furnace apparatus. More specifically, the invention is directed to methods and apparatus for inhibiting infiltration of reactive gas into insulation for a high temperature CVI/CVD furnace.

Processing of refractory composites takes place at elevated temperatures. Such processing includes CVI/CVD deposition of a binding matrix within a fibrous preform structure, and heat treating refractory composites. The reactant gas inlet that introduces the reactant gas into the furnace volume passes through the susceptor floor in the furnace. In prior art furnaces, the gas inlet is not sealed to the susceptor floor in order to allow it to move relative to the susceptor floor during heating and cooling of the furnace, and reactive gasses may leak from the volume enclosed by the susceptor and pass over and around furnace components outside the susceptor. Reactive gasses include the reactant gas used in the CVI/CVD process and gasses that are generated during heat treatment processes of refractory articles, for example carbonization of oxidized polyacrylonitrile fiber preforms. The reactive gas may attack furnace components. Porous insulation disposed around the susceptor is particularly susceptible to attack and degradation. Coated rigid insulation blocks have been used, but the coating tended to spall or crack over time and the coating became ineffective. Therefore, a method and apparatus is desired that will inhibit infiltration of reactant gas into the porous insulation over extended periods of time, preferably the life of the furnace.

SUMMARY

According to an aspect of the invention, a method is provided for inhibiting infiltration of a reactive gas into porous refractory insulation during high temperature processing of refractory composites, comprising the step of:

sealing porous refractory insulation that may be exposed to a reactive gas during high temperature processing of refractory composites with a coating sufficiently impervious to said reactive gas to block penetration of said reactive gas into said porous refractory insulation, said coating comprising a first component that is absorbed into and bonds to said porous refractory insulation, and a second component overlying said first component that forms an impervious barrier to said reactive gas.

According to a further aspect of the invention, a method is provided for inhibiting infiltration of a reactive gas into porous refractory insulation during high temperature processing of refractory composites, comprising the step of:

sealing a susceptor lid to a susceptor within a furnace with a compliant gasket impervious to reactive gas during said CVI/CVD or heat treatment process.

Further aspects of the invention are presented in the detailed description and drawings that follow.

BRIEF DESCRIPTION OF THE DRAWINGS

FIG. 5 presents an enlarged cross-sectional view of an induction coil, insulation wall, and susceptor wall construction according to an aspect of the invention.

FIG. 6 presents an isometric view of an insulation block according to an aspect of the invention.

FIG. 7 presents an isometric view of a susceptor block according to an aspect of the invention.

FIG. 8 presents an isometric sectional view of a furnace quadrant according to an aspect of the invention.

DETAILED DESCRIPTION

Figure 1:
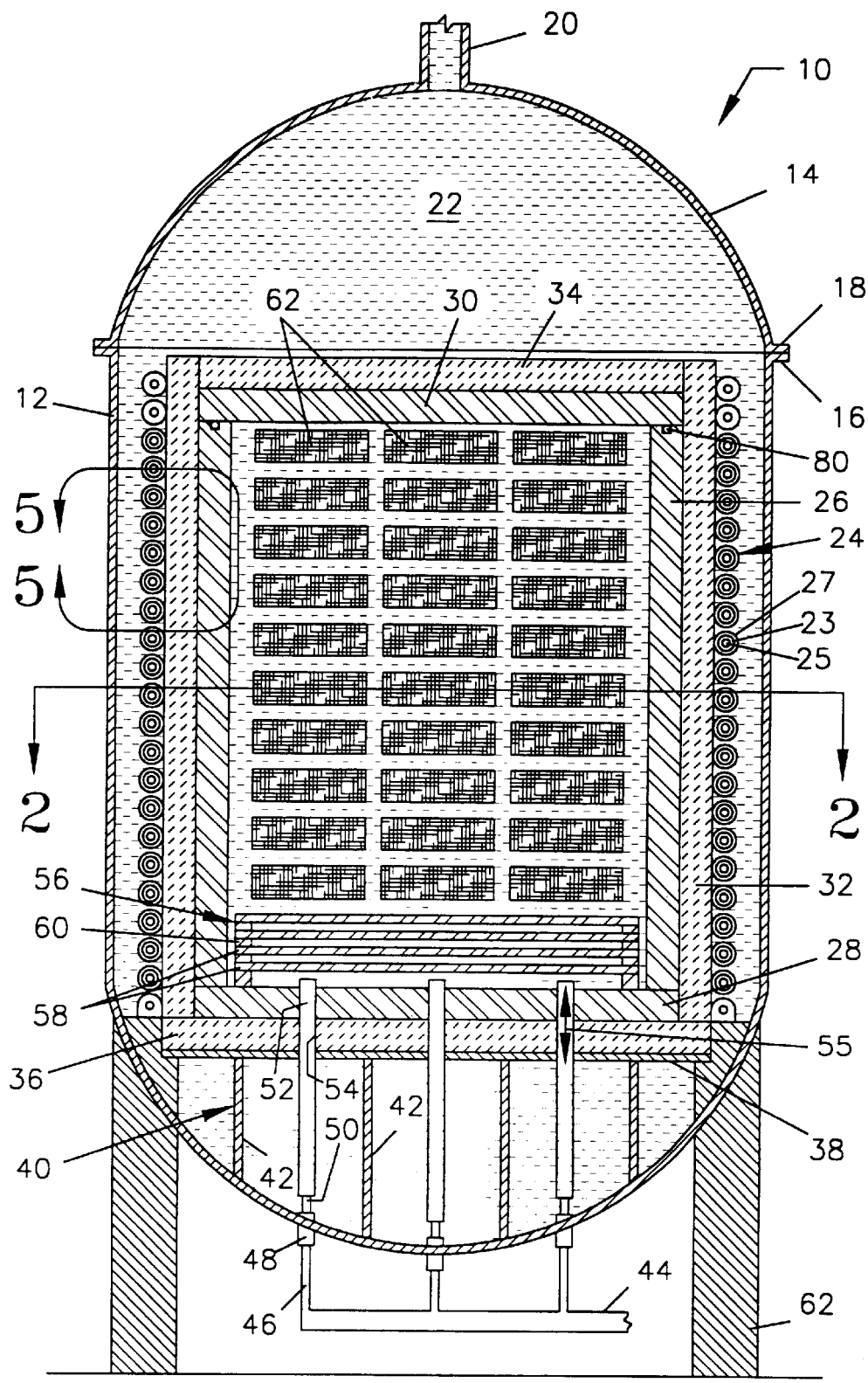
FIG. 1 presents a side cross-sectional view of a furnace according to an aspect of the invention.

Various aspects of the invention are presented in FIGS. 1–8, which are not drawn to scale, and wherein like components are numbered alike. Referring now to FIG. 1, a cross-sectional view of a high temperature furnace 10 is presented, by way of example, that implements various aspects of the invention. Furnace 10 is configured to be employed with a high temperature process. As used herein, the term "high temperature" means a temperature substantially elevated above room temperature in the range of 300 C or greater. Refractory materials, generally, are manufactured and/or processed at temperatures greater than 300 C, and may be on the order of 900–3000 C, or higher. For example, a porous carbon aircraft brake disk may have a pyrolytic carbon matrix deposited within it by a CVI/CVD process conducted at a temperature in the range of 900–1100 C, and may be heat-treated at a temperature up to 2200 C or higher. Manufacturing and processing other types of ceramic materials may occur at other temperatures. Furnaces are commonly configured specifically for processing refractory composites using high temperature processes. Such processes include deposition of a binding matrix within a porous substrate, and heat treatment processes wherein refractory composite materials are heated for a defined period of time in order to alter some aspect of the material properties. Such processes are well known in the art. As used herein, the term "refractory composites" includes fibrous refractory articles fully or partially permeated with a binding refractory matrix, and intermediate refractory articles (refractory fibrous preform structures, for example, such as carbon or ceramic fiber brake disk preforms).

Figure 2:
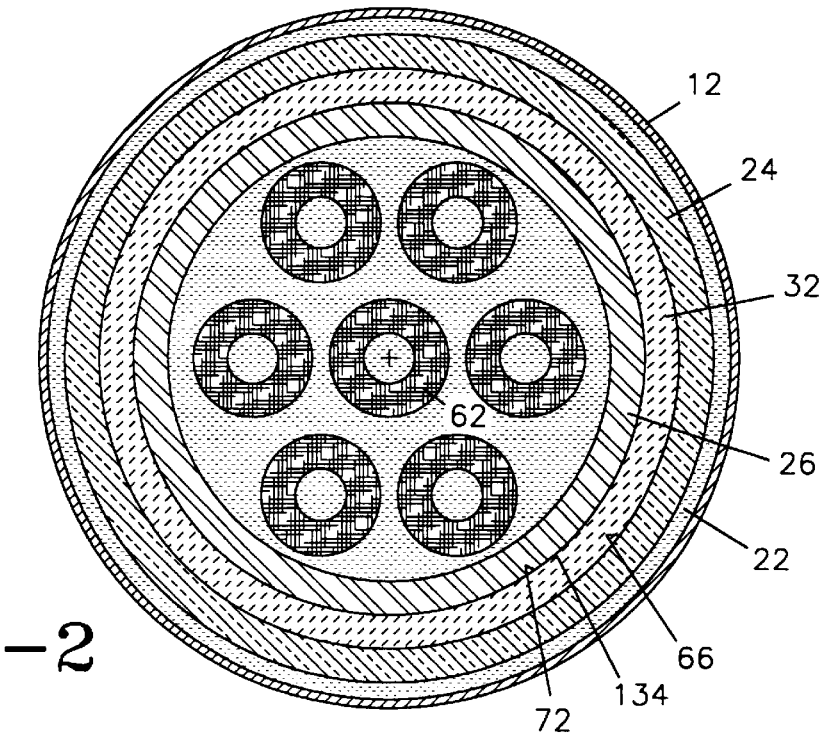
FIG. 2 presents a cross-sectional view of a furnace according to an aspect of the invention taken along line 2—2 of FIG. 1.

Furnace 10 is generally cylindrical and comprises a steel shell 12 and a steel lid 14. The shell 12 comprises a flange 16 and the lid 14 comprises a mating flange 18 that seals against flange 16 when the lid 14 is installed upon the shell 12, as shown in FIG. 1. The shell may be configured as a double wall (not shown) with cooling water flowing through the space enclosed by the double wall. The lid also comprises a vacuum port 20. The shell 12 and lid 14 together define a furnace volume 22 that is reduced to vacuum pressure by a steam vacuum generator (not shown) in fluid communication with the vacuum port 20. The shell 12 rests upon a multitude of legs 62. The furnace 10 also comprises a cylindrical induction coil 24 adjacent a cylindrical susceptor 26. The induction coil 24 comprises coiled conductors 23 encapsulated by electrical insulation 27. During operation, the induction coil 24 develops an electromagnetic field that couples with the susceptor 26 and generates heat within the susceptor 26. The induction coil 24 may be cooled, typically by integral water passages 25 within the coil 24. The susceptor 26 rests upon a susceptor floor 28 and is covered by a susceptor lid 30. A cylindrical insulation wall 32 is disposed in between the susceptor 26 and the induction coil 24. Lid insulation layer 34 and floor insulation layer 36 are disposed over the susceptor lid 30 and beneath the susceptor floor 28, respectively. The susceptor floor 28 rests upon the insulation layer 36 which, in turn, rests upon a furnace floor 38. The furnace floor 38 is attached to the shell 12 by a floor support structure 40 that comprises a multitude of vertical web structures 42. A reactant gas is supplied to the furnace 10 by a main gas supply line 44. A multitude of individual gas supply lines 46 are connected in fluid communication with a multitude of gas ports 48 that pass through the furnace shell 12. A multitude of flexible gas supply lines 50 are connected in fluid communication with the gas ports 48 and a multitude of gas inlets 52 that pass through holes 54 in the furnace floor 38, the floor insulation layer 36, and the susceptor floor 28. A gas preheater 56 rests on the susceptor floor 28 and comprises a multitude of stacked perforated plates 58 that are spaced from other by a spacing structure 60. Each plate 58 is provided with an array of perforations that are horizontally shifted from the array of perforations of the adjacent plate 58. This causes the reactant gas to pass back and forth through the plates, which diffuses the reactant gas within the preheater 56 and increases convective heat transfer to the gas from the perforated plates 58. A multitude of porous substrates 62, for example brake disks, are stacked within the furnace 10 inside the susceptor 26 on fixtures (not shown for clarity). Suitable fixtures are well known in the art. Referring now to FIG. 2, a cross-sectional view of the furnace 10 along line 2—2 of FIG. 1 is presented.

Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components. The generally known CVI/CVD processes may be classified into four general categories: isothermal, thermal gradient, pressure gradient, and pulsed flow. See W. V. Kotlensky, Deposition of Pyrolytic Carbon in Porous Solids, 8 Chemistry and Physics of Carbon, 173, 190–203 (1973); W. J. Lackey, Review, Status. and Future of the Chemical Vapor Infiltration Process for Fabrication of Fiber-Reinforced Ceramic Composites, Ceram. Eng. Sci. Proc. 10[7–8] 577, 577–81 (1989) (W. J. Lackey refers to the pressure gradient process as "isothermal forced flow"). In an isothermal CVI/CVD process, a reactant gas passes around a heated porous structure at absolute pressures as low as a few torr. The gas diffuses into the porous structure driven by concentration gradients and cracks to deposit a binding matrix. This process is also known as "conventional" CVI/CVD. The porous structure is heated to a more or less uniform temperature, hence the term "isothermal." In a thermal gradient CVI/CVD process, a porous structure is heated in a manner that generates steep thermal gradients that induce deposition in a desired portion of the porous structure. The thermal gradients may be induced by heating only one surface of a porous structure, for example by placing a porous structure surface against a susceptor wall, and may be enhanced by cooling an opposing surface, for example by placing the opposing surface of the porous structure against a liquid cooled wall. Deposition of the binding matrix progresses from the hot surface to the cold surface. In a pressure gradient CVI/CVD process, the reactant gas is forced to flow through the porous structure by inducing a pressure gradient from one surface of the porous structure to an opposing surface of the porous structure. Flow rate of the reactant gas is greatly increased relative to the isothermal and thermal gradient processes which results in increased deposition rate of the binding matrix. This process is also known as "forced-flow" CVI/CVD. Finally, pulsed flow involves rapidly and cyclically filling and evacuating a chamber containing the heated porous structure with the reactant gas. The cyclical action forces the reactant gas to infiltrate the porous structure and also forces removal of the cracked reactant gas by-products from the porous structure. The furnace and fixture configuration may vary substantially depending upon the type of process, and the various aspects of the invention may be implemented with any of these processes, depending upon the particular configuration. As such, the furnace configuration of FIG. 1 is presented by way of example, and is not intended to limit the invention to the specific arrangement presented.

Referring again to FIG. 1, according to an aspect of the invention, the gas inlet 52 extends through the hole 54 and is sealed within the hole in order to prevent leakage of reactant gas from the volume enclosed by the susceptor 26 into the volume beneath the susceptor floor 28. According to a preferred embodiment, the gas inlet is dynamically sealed to the susceptor floor 28 in a manner that permits the gas inlet 52 to cyclically translate through the hole 54 due to thermal expansion and contraction in the various furnace components induced during a CVI/CVD process. According to a further preferred embodiment, the gas inlet 52 is sealed within the hole 54 by mating the gas inlet with the hole 54 with sufficient intimacy to block leakage of gas through the hole 54 around the gas inlet 52. According to a further aspect of the invention, the insulation wall 32, and/or the floor insulation 36, and and/or the lid insulation 34 (preferably all three) are sealed with a surface coating that is sufficiently impervious to prevent penetration of reactive gas into the insulation over extended periods of time, preferably for the life of the furnace. Penetration of the reactive gas into the porous insulation components may cause degradation or CVI/CVD deposition of a binding matrix. The term reactive gas is intended to include reactant gas used in a CVI/CVD process, and certain gasses that are generated during certain heat treat processes. According to a preferred embodiment, the insulation wall 32, and/or the floor insulation 28, and and/or the lid insulation 34 (preferably all three) are formed from a rigid porous material. As used herein, the term "rigid" is intended to mean stiff rather than pliable. The coating may be formed by various methods that develop the required degree of imperviousness to reactive gas at elevated temperatures, including bonding an impervious sheet to the insulation, and painting a liquid on to the insulation that subsequently hardens into an impervious coating. According to a preferred embodiment, the coating comprises a first component that is absorbed into and bonds to the porous insulation, and a second component overlying the first component that forms an impervious barrier to the reactive gas. For example, the first component may be a paint having a relatively low viscosity that permits it to penetrate and absorb into the porous insulation, and the second component may be a liquid coating having a relatively greater viscosity and is hardened by a subsequent cure. In this example the first and second components are both liquids that harden subsequent to application. The second component may be replaced by an impervious sheet material. Deposition of a binding matrix within the insulation components may also be minimized or prevented merely by sealing the gas inlet 52 within the hole 54. Thus, the various aspects of the invention described herein may be employed independently of each other, alone, with or without combining them with other aspects of the invention. On the other hand, certain implementations may benefit from combining two or more of the several aspects described herein.

Still referring to FIG. 1, a method according to an aspect of the invention is provided for preventing gas leakage around the gas inlet 52 extending through the hole 54 in the susceptor floor 28 in the CVI/CVD furnace 10. The method comprises the steps of: sealing the gas inlet 52 to the susceptor floor 28 with sufficient intimacy to block leakage of gas through the hole 54 around the gas inlet 52 while allowing the gas inlet 52 to cyclically translate through the hole 54, as indicated by arrow 55, due to thermal expansion and contraction induced by thermal cycles in the CVI/CVD furnace 10. The gas inlet 52 preferably forms a sliding fit with the hole 54 in order to permit the gas inlet 52 to cyclically translate through the hole 54, thus permitting the relative thermal expansion and contraction. According to a further aspect of the invention, a method is provided for preventing gas leakage around the gas inlet 52 extending through the hole 54 in the susceptor floor 28 in the CVI/CVD furnace 10, comprising the steps of: sealing the gas inlet 52 to the susceptor floor 28 with an insulating layer disposed between the gas inlet 52 and the susceptor floor 28 with sufficient intimacy to block leakage of gas through the hole 54 around the gas inlet 52. According to yet another aspect of the invention, a method is provided for preventing gas leakage around the gas inlet 52 extending through the hole 54 in the susceptor floor 28 in the CVI/CVD furnace 10, comprising the steps of: sealing the gas inlet 52 to the susceptor floor 28 with an insulating layer disposed between the gas inlet 52 and the susceptor floor 28 with sufficient intimacy to block leakage of gas through the hole 54 around the gas inlet 52 while allowing the gas inlet 52 to cyclically translate through the hole 54 due to thermal expansion and contraction induced by thermal cycles in the CVI/CVD furnace 10. According to a preferred embodiment, the gas supply lines 50 are rigidly connected to the gas ports 48 and are flexible in a lengthwise direction to permit the gas inlet 52 to move vertically, as indicated by arrow 55, during heating and cooling of the furnace 10. The gas supply line 50 may be formed as a stainless steel bellows and covered with a braided stainless steel sheath. Other constructions may be suitable depending upon the application and the temperature requirements.

Figure 3:
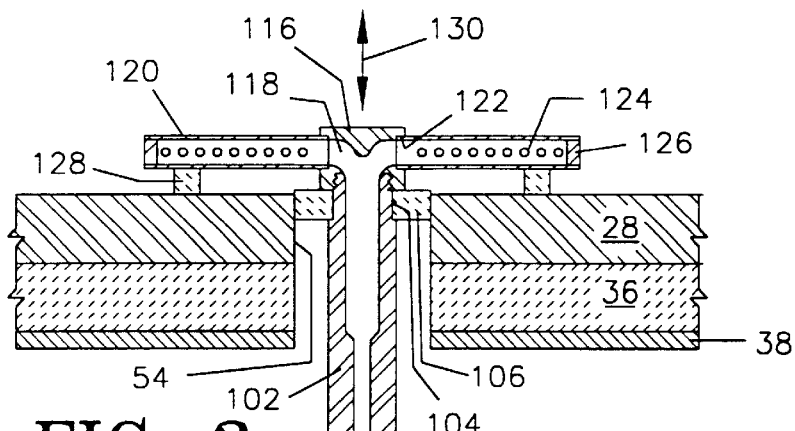
FIG. 3 presents an enlarged cross-sectional view of a gas inlet according to an aspect of the invention.

Referring now to FIG. 3, a cross-sectional view of a preferred embodiment of an apparatus is presented for carrying out a process according to an aspect of the invention. A gas inlet 100 is provided for passing gas through the susceptor floor 28 in the CVI/CVD furnace 10. The gas inlet 100 extends through the hole 54 in the susceptor floor 28 and comprises an impervious tube 102 having an outside surface 104, and a bushing 106 encircling at least one end of the impervious tube 102 and mating with the outside surface 104 with sufficient intimacy to block leakage of the gas between the impervious tube 102 and the bushing 106 during a CVI/CVD process, the bushing 106 being configured to mate with the hole 54 with sufficient intimacy to block leakage of the gas past the bushing 106. The bushing 106 preferably forms a sliding fit with the hole 54 in order to permit the gas inlet 100 to cyclically translate through the hole relative to the susceptor floor 28, as indicated by arrow 130, due to thermal expansion and contraction of the various furnace components that is induced by heating and cooling of the furnace inherent in CVI/CVD and heat treatment processes.

Heat transfer from the susceptor floor 28 to the gas inlet 100 is preferably minimized. According a particularly preferred embodiment, the bushing 106 has a lesser thermal conductivity than the impervious tube 102, which inhibits heat transfer from the susceptor floor 28 to the impervious tube 102. Thus, the bushing may also act as an insulator. In a certain embodiment, the bushing 106 is a porous disk comprising a coating that prevents infiltration of gas into the porous disk during the CVI/CVD process. The impervious tube 102 is elongate in a lengthwise direction and the impervious tube 102 may be provided with a lesser thermal conductivity in the lengthwise direction than the susceptor floor 28 in order to inhibit heat transfer along the impervious tube 28 in the lengthwise direction, which further inhibits heat transfer from the susceptor floor 28.

Figure 4:
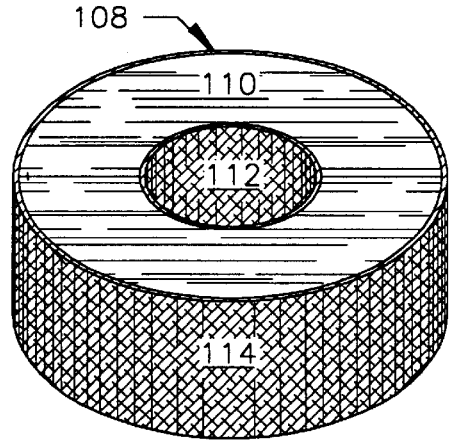
FIG. 4 presents an isometric view of a gas inlet bushing according to an aspect of the invention.

Referring now to FIG. 4, an isometric view of a bushing 108 according to an aspect of the invention is presented. Bushing 108 comprises a disk 110, an outside circumferential gasket 114 and an inside circumferential gasket 112, both bonded to the disk 110. The inside circumferential gasket 112 provides a seal between the disk 110 and the impervious tube 102 (FIG. 3), and the outside circumferential gasket 114 provides a seal between the disk 110 and the hole 54 in the susceptor floor 28. The disk 110 is preferably made from a porous material and acts as an insulator. In the event the disk 110 is made from a porous material, it is preferably sealed with a coating that is sufficiently impervious to block penetration of reactant gas into the disk 110. The flat faces of the disk 110 may be sealed using coating that is liquid and painted on to the disk 110 and/or an impervious sheet material that is bonded to the disk 110.

Referring again to FIG. 3, a manifold 116 may be attached to the gas inlet 100. The manifold 116 has at least one internal passage 118 in fluid communication with the impervious tube 102 and comprises at least one piccolo tube 120 that distributes gas a distance from the impervious tube 102. The piccolo tube 120 comprises an array of holes 124, and is preferably disposed parallel to the susceptor floor 28. The manifold 116 and piccolo tube 120 may be fabricated from separate pieces. In such a case, the piccolo tube 120 may be received within a mating recess 122 within the manifold 116, and the piccollo tube 120 may comprise a separate plug piece 126 at the end that terminates the piccolo tube 120 and forces the reactant gas to flow out the array of holes 124. According to a particularly preferred embodiment, the manifold is attached to the gas inlet 100 with sufficient intimacy to block leakage of gas between the manifold 116 and said impervious tube 102. One end of the impervious tube 102 is externally threaded and the manifold 116 comprises a mating internal thread, and the manifold is attached to the gas inlet 100 by the impervious tube 102 being threaded into the manifold 116. The manifold 116 is preferably spaced from the susceptor floor 28 in order to allow it move with the impervious tube 102, as may be caused by thermal expansion and contraction. The piccolo tube may rest upon insulating blocks 128 disposed upon the susceptor floor 28. The various components presented in FIG. 3 are preferably formed from refractory materials, except the furnace floor 38 and the flexible gas supply line 50 that may be formed from non-refractory materials to the extent that such materials can function in the temperatures to which those components are exposed during a CVI/CVD or heat treat process, depending upon the application.

Referring again to FIG. 1, a method of inhibiting deposition of a binding matrix within porous refractory insulation during a CVI/CVD process is provided, according to an aspect of the invention, comprising the step of: sealing the susceptor lid 30 to the susceptor 26 within the furnace 10 with a compliant gasket 80 impervious to reactant gas during the CVI/CVD process. The compliant gasket 80 may be braided and, according to a preferred embodiment, is a refractory material such as braided graphite foil. A suitable braided graphite foil is available from EGC Enterprises, Inc., Ohio, United States of America. A groove may be provided in the top surface of the susceptor 26 that receives the compliant gasket 80.

Referring now to FIG. 5, an enlarged view of an embodiment of the furnace wall as indicated by 5—5 of FIG. 1 is presented. According to a preferred embodiment, a compressible wall layer 68 is provided between the induction coil 24 and the insulation wall 32 and/or an impervious wall layer 70 is provided between the insulation wall 32 and the susceptor 26. According to a preferred embodiment, the compressible wall layer 68 and the impervious layer 70 are employed. The compressible wall layer 68 is particularly desirable if the insulation wall 32 is made from a rigid material, and serves to distribute loads induced upon the induction coil 24 induced by thermal expansion of the insulation wall 32 during a CVI/CVD or heat treatment process. The compressible wall layer 68 prevents structural failure of the insulation wall 32 that may otherwise be caused by thermally induced stresses. The impervious wall layer may be employed to block radiation from the susceptor 26 to the insulation wall 32, and to block penetration of reactant gas through the susceptor 26 into the insulation wall 32. The impervious wall layer may also exhibit some compressibility that reduces thermally induced stresses on the insulation. In a preferred embodiment, the compressible wall layer 68 is a carbon felt, and the impervious wall layer 70 is a graphite foil sheet.

Referring again to FIG. 1, according to a further aspect of the invention, a method is provided for inhibiting deposition of a binding matrix within porous insulation during a CVI/CVD process, comprising the step of sealing porous insulation (for example the insulation wall 32, the floor insulation 36, and the lid insulation 34) that may be exposed to a reactive gas during the CVI/CVD process with a coating sufficiently impervious to the reactive gas to block penetration of the reactive gas into the porous insulation. According to another aspect of the invention, a method is provided for insulating an induction coil 24 for a CVI/CVD furnace 10 that defines a cylindrical inside surface, comprising the step of disposing a porous insulation 32 adjacent to the inside surface of the cylindrical induction coil 24, the porous insulation 32 being sealed with a coating sufficiently impervious to reactive gas to block penetration of the reactive gas into the porous refractory insulation during a CVI/CVD process. These methods may further comprise the step of sealing the porous insulation by coating it with a layer of material that is sufficiently impervious to the reactive gas to block penetration of the reactive gas into the porous insulation. For a CVI/CVD process at elevated temperature, such as for depositing pyrolytic carbon, the porous insulation is preferably made from a refractory material. The method may further comprise the step of sealing the porous insulation by coating it with a layer of material that is sufficiently impervious to the reactive gas to block penetration of the reactive gas into the porous insulation. The porous insulation is made from a rigid insulating material and, according to preferred embodiment, is also a refractory material.

Referring now to FIGS. 2 and 5, a method is provided of insulating an induction coil 24 for a CVI/CVD furnace that defines a cylindrical inside surface 66 to be insulated, comprising the steps of: covering the cylindrical inside surface 66 with a first compressible layer 68; covering the first compressible 68 layer with an insulation wall 32 that is rigid; covering the insulation wall 32 with an impervious layer 70 on a side 72 opposite the first compressible layer 68; and, disposing a cylindrical susceptor 26 immediately adjacent the impervious layer 70. The impervious layer 70 is impervious to reactant gas that may penetrate the susceptor wall 26 during a CVI/CVD process. It also significantly reduces radiation heat transfer from the susceptor wall 26 to the insulation wall 32.

According to a further aspect of the invention, a method is provided for alleviating stresses due to differences in thermal expansion and contraction in the induction coil 24 and a rigid cylindrical insulation wall 32 of the type wherein the induction coil 24 defines a cylindrical inside surface 66 disposed around the cylindrical rigid insulation 32, comprising the step of: forming a smooth surface on the cylindrical rigid insulation wall 32 adjacent the cylindrical inside surface 66. According to yet a further aspect of the invention, a method is provided for alleviating stresses due to differences in thermal expansion and contraction in a rigid cylindrical insulation wall 32 and the susceptor 26 of the type wherein the rigid cylindrical insulation wall 32 is disposed around a cylindrical outside surface 134 of the susceptor 26, comprising the step of: forming smooth surfaces on the cylindrical outside surface 134 and the rigid cylindrical insulation wall 32 adjacent the cylindrical outside surface 134.

Referring now to FIG. 6, an isometric view of an insulation wall block 74 is presented according to an aspect of the invention. The insulation block 74 is made from a rigid insulating material, preferably a porous refractory material. The insulation block comprises an inside face 76 and an opposing outside face 78 (hidden behind inside face 76). One or both of these faces may be flat or curved, with a curved surface being preferred. One edge comprises a tongue 180, with the opposing edge comprising a mating groove 82. One of the edges interconnecting the opposing edges 180 and 82 comprises a lap portion 84, with the opposing interconnecting edge comprising a mating lap portion 86. Referring now to FIG. 7, a susceptor block 88 is presented made from a suscepting material, preferably a refractory material. The susceptor wall block 88 comprises an inside face 90 and an opposing outside face 92 (hidden behind the inside face 90). One or both of these faces may be flat or curved, with a curved surface being preferred. One edge comprise a tongue 94, with the opposing edge comprising a mating groove 96. One of the edges interconnecting the opposing edges 94 and 96 comprises a lap portion 98, with the opposing interconnecting edge comprising a mating lap portion 99.

Referring now to FIG. 8, a quadrant section 150 of a cylindrical induction coil 152, susceptor 156 and insulation wall 154 resting upon a furnace floor 158 is presented according to an aspect of the invention. A copper plate 160 is disposed upon the furnace floor 158, and a layer first compressible floor layer 161 is disposed over the copper plate 160. A floor insulation 162 is disposed upon the first compressible layer 161. The floor insulation 162 is preferably formed from a porous refractory insulation material, and may include a multitude of floor insulation inserts 164 that have a higher compressive strength than the bulk of the floor insulation 162 in order to increase the overall compressive strength of the floor insulation 162 without significantly reducing its overall insulation properties. A second compressible floor layer 166 is disposed upon the floor insulation 162, and an impervious floor layer 168 is disposed over the insulation. The impervious floor layer 168 inhibits infiltration of reactant gas into the felt layer 166 and the floor insulation 162, and inhibits radiative heat transfer to the components disposed below the impervious floor layer 168. An additional impervious floor layer not shown) may be disposed immediately beneath the compressible floor layer 166. A susceptor floor 170 is disposed upon the refractory felt layer 166. The first and second compressible floor layers 161 and 166 serve to distribute loads at the interface between two relatively rigid components in the floor construction.

The insulation wall 154 and susceptor 156 are built as follows. A compressible wall layer 172, preferably a refractory felt, is placed against the inside surface of the induction coil 152. An adhesive, for example a spray-tack adhesive, may employed to bond the compressible wall layer 172 to the induction coil 152. Next, a multitude of the insulation blocks 74 are assembled to form the cylindrical insulation wall 154. The blocks are horizontally abutted next to each other with the lap portion 84 (FIG. 6) of one block overlapping the mating lap portion 86 (FIG. 6) of the adjacent block. The blocks are vertically stacked with the tongue portion 80 of one block engaging the mating groove portion 82 of the adjacent block. Vertical seams are preferably misaligned, as shown in FIG. 8, in order to strengthen the wall. Several rows of insulation blocks 74 are stacked in such manner to the desired height. An impervious wall layer 174 is then placed against the inside surface of the insulation wall 154. An adhesive, for example a spray-tack adhesive, may be employed to bond the impervious wall layer 174 to the insulation wall 154. Finally, a multitude of the susceptor blocks 88 are assembled to form the cylindrical susceptor 156. The blocks are horizontally abutted next to each other with the lap portion 98 (FIG. 7) of one block overlapping the mating lap portion 99 (FIG. 7) of the adjacent block. The blocks are vertically stacked with the tongue portion 94 of one block engaging the mating groove portion 96 of the adjacent block. Vertical seams are preferably misaligned, as shown in FIG. 8, in order to strengthen the wall. Several rows of susceptor blocks 88 are stacked in such manner to the desired height. The top row of insulation blocks 76 typically extends above the top row of susceptor blocks 88 in order to permit the susceptor lid to seat upon the susceptor blocks 88. The exposed surfaces of insulation blocks 76 that form the top row are preferably covered with an impervious sheet material that is bonded to the insulation blocks 76 in order to provide additional protection against reactive gas exiting the susceptor lid. The top surfaces of the insulation blocks 76 immediately below the top row are preferably covered with an impervious sheet material in order to prevent reactive gas from penetrating the insulation wall 156 below the top row of insulation blocks 76.

According to a certain embodiment for CVI/CVD processing and heat treating carbon/carbon aircraft brake disks, the gas inlet of 100 of FIG. 3 is used with a furnace configured according to the quadrant 150 of FIG. 8. Referring specifically to FIG. 3, the various components of the gas inlet 100 are manufactured from monolithic graphite, such as CS grade graphite, available from UCAR Carbon Company Inc., United States of America, or HLM grade graphite, available from SGL Carbon Corporation, United States of America. The impervious tube 102 is manufactured from monolithic graphite having a lesser thermal conductivity, such as CBN grade graphite, also available from UCAR Carbon Company Inc. This material also has a greater electrical resistivity than the susceptor floor, which reduces electromagnetic coupling with the induction coil and reduces heat generation in the tube 102. The bushing 108 and spacer 128 are manufactured from a graphite foam, such as Cal-Foam® material, available from SIGRI Polyarbon, Inc., United States of America. The inside circumferential gasket 112 is optional since the disk 110 is captive between the manifold 116 and a ledge formed on the impervious tube 102, which provides a sufficient seal. The outside circumferential seal 114 is formed from graphite foil sheet, such as Grafoil® material available from UCAR Carbon Company Inc., or Calgraph® material, available from SIGRI Polycarbon, Inc. Both flat faces of the disk 110 are preferably covered by graphite foil sheet. The graphite foil sheet is bonded to the disk 110 using graphite cement. Now referring specifically to FIG. 8, the susceptor wall blocks are manufactured from monolithic graphite having suitable suscepting qualities, such as CS grade graphite, available from UCAR Carbon Company Inc., United States of America, or HLM grade graphite, available from SGL Carbon Corporation, United States of America. The insulation wall blocks 74 are machined from a rigidized felt blocks, such as Calcarb CBCF material, available from Calcarb, Ltd., Scotland, or Fibergraph® material, available from SIGRI Polycarbon, Inc., United States of America. All external surfaces of these insulation wall blocks 74 are coated with a graphite paint, such as TC-2 graphite paint, available from EGC Enterprises Inc, United States of America. The outside diameter surface of each block is further sealed with an additional coat of phenolic based paint, such as Rigidseal® paint, available from SIGRI Polycarbon, Inc. The inside diameter and top surface of each insulation block that comprise the top row of insulation blocks 74 are covered with a graphite foil, as previously specified, that is graphite cemented to the block, using Graphi-Bond 669 adhesive, available from Aremco Products Inc., United States of America. The top surfaces of the insulation blocks 74 immediately below the top row of blocks is also covered with graphite foil in the same manner. The top row of blocks is sacrificial and may be removed and replaced if matrix is deposited within the blocks or if they otherwise become damaged. The floor insulation 162 is also manufactured from rigid carbon felt and coated in the same manner as previously described in relation to the insulation blocks 74. The floor insulation 164 inserts are machined from a porous carbon, such as Porous Carbon 60 material, available from UCAR Carbon Company Inc., United States of America. The refractory felt layer 166 is a carbon felt, such as Polycarbon Soft Felt material, available from SIGRI Polycarbon, Inc. The impervious layer 168 is a graphite foil, as previously specified. The susceptor floor is manufactured from a similar monolithic graphite as the susceptor wall blocks 88. The impervious wall layer is a graphite foil sheet made from the same material as layer 168, and the compressilbe wall layer 174 is a carbon felt made from the same material as layer 166. A graphite foil tape, with a pressure sensitive adhesive on one side, is used to cover all graphite foil seams in order to prevent penetration of reactive gas and radiation shine-through.

Many variations are evident from the description provided herein without departing from the true scope and spirit of the invention as defined by the claims that follow.

What is claimed is:

1. A method of inhibiting infiltration of a reactive gas into porous refractory thermal insulation during high temperature processing of refractory composites, comprising the step of:

sealing porous refractory insulation that may be exposed to a reactive gas during high temperature processing of refractory composites with a coating sufficiently impervious to said reactive gas to block penetration of said reactive gas into said porous refractory insulation, said coating comprising a first component that is absorbed into and bonds to said porous refractory insulation, and a second component overlying said first component that forms an impervious barrier to said reactive gas.

2. A method of inhibiting infiltration of a reactive gas into porous refractory thermal insulation during high temperature processing of refractory composites, comprising the step of:

sealing a susceptor lid to a susceptor within a furnace with a compliant gasket impervious to reactive gas during said CVI/CVD or heat treatment process.

3. A method of inhibiting infiltration of a reactive gas into porous refractory thermal insulation during high temperature processing of refractory composites, comprising the step of:

sealing a susceptor lid to a susceptor within a furnace with a braided gasket impervious to reactive gas during high temperature processing of refractory composites.

4. A method of insulating an induction coil for a furnace configured to process refractory composites, the induction coil having a cylindrical inside surface, comprising the step of:

disposing a porous refractory thermal insulation adjacent said inside surface of said cylindrical induction coil for said furnace configured to process refractory composites, said porous refractory thermal insulation being sealed with a coating sufficiently impervious to reactive gas to block penetration of said reactive gas into said porous refractory thermal insulation, said coating comprising a first component that is absorbed into and bonds to said porous refractory insulation, and a second comnponent overlying said first component that forms an impervious barrier to said reactive gas.

5. A method of insulating an induction coil for a furnace configured to process refractory composites, the induction coil having a cylindrical inside surface to be insulated, comprising the step of:

covering said cylindrical inside surface of said induction coil for said furnace configured to process refractory composites with a first compressible layer;

covering said first compressible layer with a rigid refractory thermal insulation; covering said rigid refractory thermal insulation with an impervious layer on a side opposite said first comprehensible layer; and, disposing a cylindrical susceptor immediately adjacent said impervious layer.

6. The method of claim 5, further comprising the step of assembling said rigid refractory thermal insulation from a multitude of rigid refractory insulation blocks.

7. The method of claim 5 further comprising the step of sealing at least a portion of said rigid refractory thermal insulation with a coating sufficiently impervious to reactive gas to block penetration of said reactive gas into said rigid refractory thermal insulation, said coating comprising a first component that is absorbed into and bonds to said rigid refractory thermal insulation, and a second component overlying said first component that forms an impervious barrier to said reactive gas.

8. A method of alleviating stresses due to differences in thermal expansion and contraction in an induction coil and a cylindrical rigid thermal insulation wall within a furnace configured to process refractory composites of the type wherein said induction coil defines a cylindrical inside surface disposed around said cylindrical rigid thermal refractory insulation, comprising the step of: forming a smooth surface on said cylindrical rigid refractory insulation wall adjacent said cylindrical inside surface.

9. A method of alleviating stresses due to differences in thermal expansion and contraction in a cylindrical rigid thermal insulation wall and a susceptor within a furnace configured to process refractory composites of the type wherein said cylindrical rigid refractory insulation is disposed around a cylindrical outside surface of said susceptor, comprising the step of: forming smooth surfaces on said cylindrical outside surface and said cylindrical rigid refractory insulation wall adjacent said cylindrical outside surface.

* * * * *